(12) United States Patent
Lee et al.

(10) Patent No.: US 7,176,747 B2
(45) Date of Patent: Feb. 13, 2007

(54) MULTI-LEVEL HIGH VOLTAGE GENERATOR

(75) Inventors: Seung-Jae Lee, Seoul (KR); Dae-Seok Byeon, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 115 days.

(21) Appl. No.: 10/940,808

(22) Filed: Aug. 24, 2004

(65) Prior Publication Data

US 2005/0127981 A1 Jun. 16, 2005

(30) Foreign Application Priority Data

Dec. 11, 2003 (KR) .................. 10-2003-0090190

(51) Int. Cl.
*G05F 1/10* (2006.01)
(52) U.S. Cl. ......................... 327/536; 363/60
(58) Field of Classification Search .............. 327/60, 327/63, 535, 356, 537, 534
See application file for complete search history.

(56) References Cited

U.S. PATENT DOCUMENTS

| | | | |
|---|---|---|---|
| 5,767,735 A | 6/1998 | Javanifard et al. ......... 327/536 |
| 5,812,017 A * | 9/1998 | Golla et al. ................ 327/536 |
| 5,969,565 A * | 10/1999 | Naganawa .................. 327/536 |
| 5,999,475 A | 12/1999 | Futatsuya et al. .......... 365/226 |
| 6,055,168 A | 4/2000 | Kotowski et al. |
| 6,275,096 B1 * | 8/2001 | Hsu et al. ................... 327/535 |
| 6,278,315 B1 * | 8/2001 | Kim ........................... 327/536 |
| 6,278,316 B1 * | 8/2001 | Tanzawa et al. ............ 327/536 |
| 6,278,317 B1 * | 8/2001 | Hsu et al. ................... 327/536 |
| 6,344,984 B1 * | 2/2002 | Miyazaki .................... 363/60 |
| 6,404,274 B1 * | 6/2002 | Hosono et al. ............. 327/538 |
| 6,597,235 B2 * | 7/2003 | Choi ........................... 327/536 |

(Continued)

FOREIGN PATENT DOCUMENTS

DE 102 20 561 A 1 12/2002

(Continued)

OTHER PUBLICATIONS

English language Abstract for Korean Patent Publication No. 10-1997-0081274 (1996-0061020).

(Continued)

*Primary Examiner*—Linh My Nguyen
*Assistant Examiner*—Thomas J. Hiltunen
(74) *Attorney, Agent, or Firm*—Marger Johnson & McCollom, P.C.

(57) ABSTRACT

A multi-level high voltage generator according to embodiments of the invention is capable of simultaneously generating high voltages of various levels by using one charge pump. The multi-level high voltage generator includes a charge pump unit, a voltage divider unit, and a pump control unit. The charge pump unit raises an input voltage applied at an input terminal to simultaneously output a number of high voltages having different levels. The voltage divider unit divides the voltages from the charge pump unit. The pump control unit operates according to an enable signal and generates pump control signals in response to a reference voltage, a control clock signal, and a divided voltage from the voltage divider unit. The charge pump unit generates the high voltages and is controlled by the pump control signals from the pump control unit.

18 Claims, 8 Drawing Sheets

U.S. PATENT DOCUMENTS

| | | | |
|---|---|---|---|
| 6,774,710 B2* | 8/2004 | Li | 327/536 |
| 6,816,001 B2* | 11/2004 | Khouri et al. | 327/536 |
| 6,853,567 B2* | 2/2005 | Kwon | 363/60 |
| 6,856,525 B2* | 2/2005 | Wallis | 363/59 |
| 2002/0130701 A1* | 9/2002 | Kleveland | 327/536 |
| 2003/0067429 A1 | 4/2003 | Aoki et al. | |
| 2003/0112056 A1* | 6/2003 | Tanzawa et al. | 327/536 |
| 2003/0151449 A1* | 8/2003 | Nakagawa et al. | 327/536 |
| 2005/0168263 A1* | 8/2005 | Fukuda et al. | 327/535 |
| 2005/0195019 A1* | 9/2005 | Okamoto | 327/536 |
| 2006/0087899 A1* | 4/2006 | Chae et al. | 365/189.09 |

FOREIGN PATENT DOCUMENTS

| | | |
|---|---|---|
| KR | 10-1997-0081274 | 7/1999 |
| KR | 10-1998-0015950 | 12/1999 |
| WO | WO 02/19508 A2 | 3/2002 |

OTHER PUBLICATIONS

English language Abstract for Korean Patent Publication No. 10-1998-0015950 (1999-0084298).

Dickson, John F., "On-Chip High-Voltage Generation in MNOS Integrated Circuits Using an Improved Voltage Multiplier Technique," IEEE Journal of Solid-State Circuits, Jun. 1976, vol. SC-11, No. 3.

* cited by examiner

Fig. 1
(Conventional)
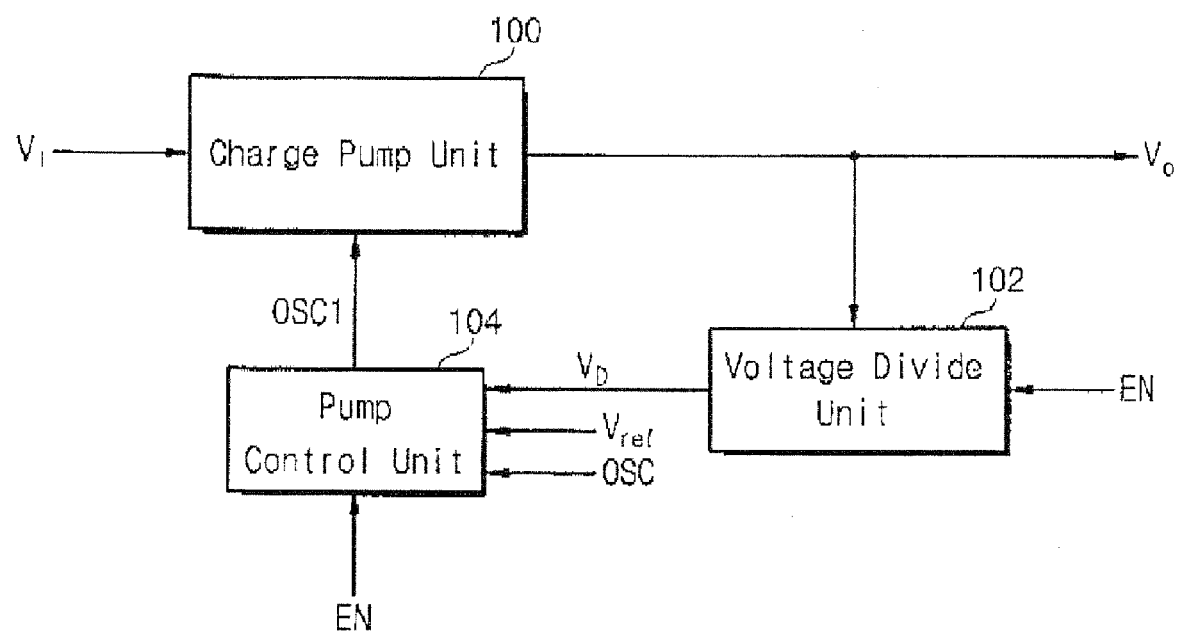

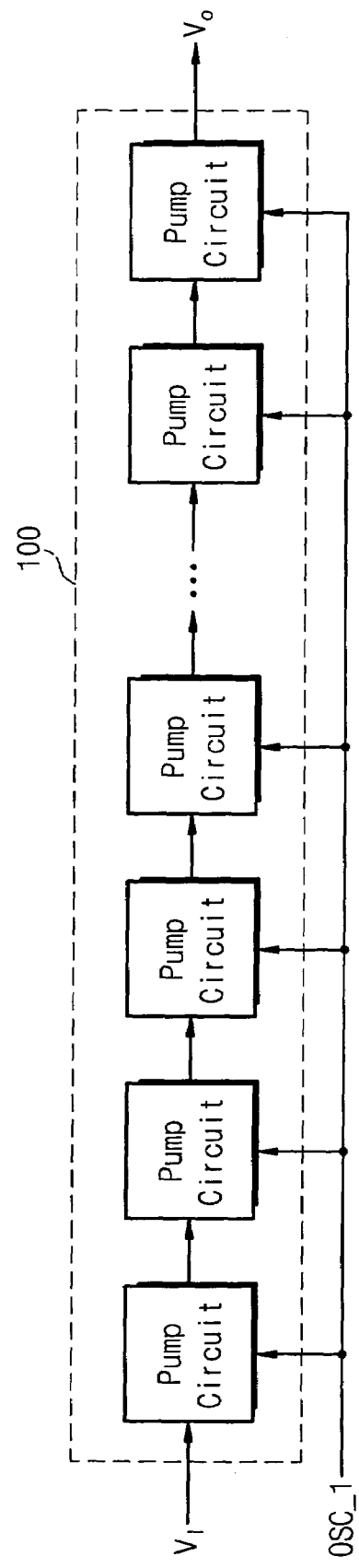
Fig. 2
(Conventional)

MULTI-LEVEL HIGH VOLTAGE GENERATOR

CROSS REFERENCE TO RELATED APPLICATIONS

This application claims priority from Korean Patent Application 2003-90190, filed on 11 Dec. 2003, the contents of which are incorporated by reference in their entirety for all purposes.

BACKGROUND OF THE INVENTION

1. Technical Field of the Invention

This disclosure generally relates to a high voltage generator of a semiconductor device, such as a flash memory, and more specifically, to a multi-level high voltage generator capable of generating and outputting various high voltage levels using one charge pump.

2. Description of the Related Art

Generally, programming or erasing data in a flash memory requires a voltage with a relatively high voltage level (or high voltage). The flash memory achieves this high voltage by means of a high voltage generator that uses a charge pump.

FIG. 1 is a block diagram of a conventional high voltage generator. As illustrated in FIG. 1, the conventional high voltage generator includes a charge pump unit 100, a voltage divider unit 102, and a pump control unit 104. This high voltage generator raises an input voltage VI to a desired target voltage and outputs the same.

The charge pump unit 100 includes a number of pump circuits serially connected as illustrated in FIG. 2. Referring to FIG. 2, each of the pump circuits produces an output voltage that is raised with respect to an input voltage, and the output voltage becomes the input voltage for the next pump circuit connected in the series. In this case, the pump circuits raise voltage in response to a pump control signal OSC_1 inputted from a pump control unit 104. If the pump control signal OSC_1 is not inputted from the pump control unit 104, the individual pump circuits of the charge pump unit 100 do not perform a voltage raise operation.

The voltage divider unit 102 operates according to an external enable signal EN, and divides an output voltage $V_O$ of the charge pump unit to generate a divided voltage $V_D$. The voltage level of the divided voltage $V_D$ is determined according to the resistance values of serially connected resistors within the voltage divider unit 102.

The pump control unit 104 generates a pump control signal OSC_1 for controlling a voltage raise operation of each of the pump circuits according to the divided voltage $V_D$ from the voltage divider unit 102, an externally applied reference voltage Vref, the control clock signal OSC, and the enable signal EN. That is, if the divided voltage $V_D$ is lower than the reference voltage Vref, an output voltage of the charge pump unit 100 does not reach the target voltage. Thus, the pump control unit 100 generates a pump control signal OSC_1 using a control clock signal OSC and transfers the pump control signal OSC_1 to each pump circuit to perform a voltage raise operation. Meanwhile, if the divided voltage $V_D$ is higher than a reference voltage Vref, the output voltage of the charge pump unit 100 reached the target voltage. Thus, the pump control unit 100 stops the voltage operation by not generating the pump control signal OSC_1.

However, the conventional high voltage generator in this structure may simultaneously generate a voltage having only one voltage level. Therefore, if a number of voltages having different levels is required, additional high voltage generators should be prepared according to the circumstances. This increases the overall circuit area required for the high voltage generator and an ability to achieve highly integrated devices is degraded.

Embodiments of the invention address these and other disadvantages of the conventional art.

SUMMARY OF THE INVENTION

Embodiments of the invention provide a multi-level high voltage generator capable of receiving one input voltage to simultaneously generate high voltages of various levels. The multi-level high voltage generator may include a charge pump unit, a voltage divider unit, and a pump control unit. The charge pump unit raises one input voltage applied at an input terminal to generate a plurality of high voltages having different levels. The voltage divider unit operates according to an external enable signal and divides the high voltages inputted from the charge pump unit. The pump control unit operates according to the enable signal and generates pump control signals corresponding to each of divided voltages in response to a reference voltage, a control clock signal, and the divided voltage from the voltage divider unit. Meanwhile, the charge pump unit is controlled by the pump control signals to perform a voltage raise operation for generating the high voltages.

BRIEF DESCRIPTION OF THE DRAWINGS

FIG. 1 is a block diagram illustrating a conventional high voltage generator.

FIG. 2 is a block diagram illustrating a charge pump unit of the conventional high voltage generator shown in FIG. 1.

DETAILED DESCRIPTION OF THE INVENTION

The invention will be described more fully hereinafter with reference to the accompanying drawings, in which some exemplary embodiments of the invention are shown.

Figure 3:
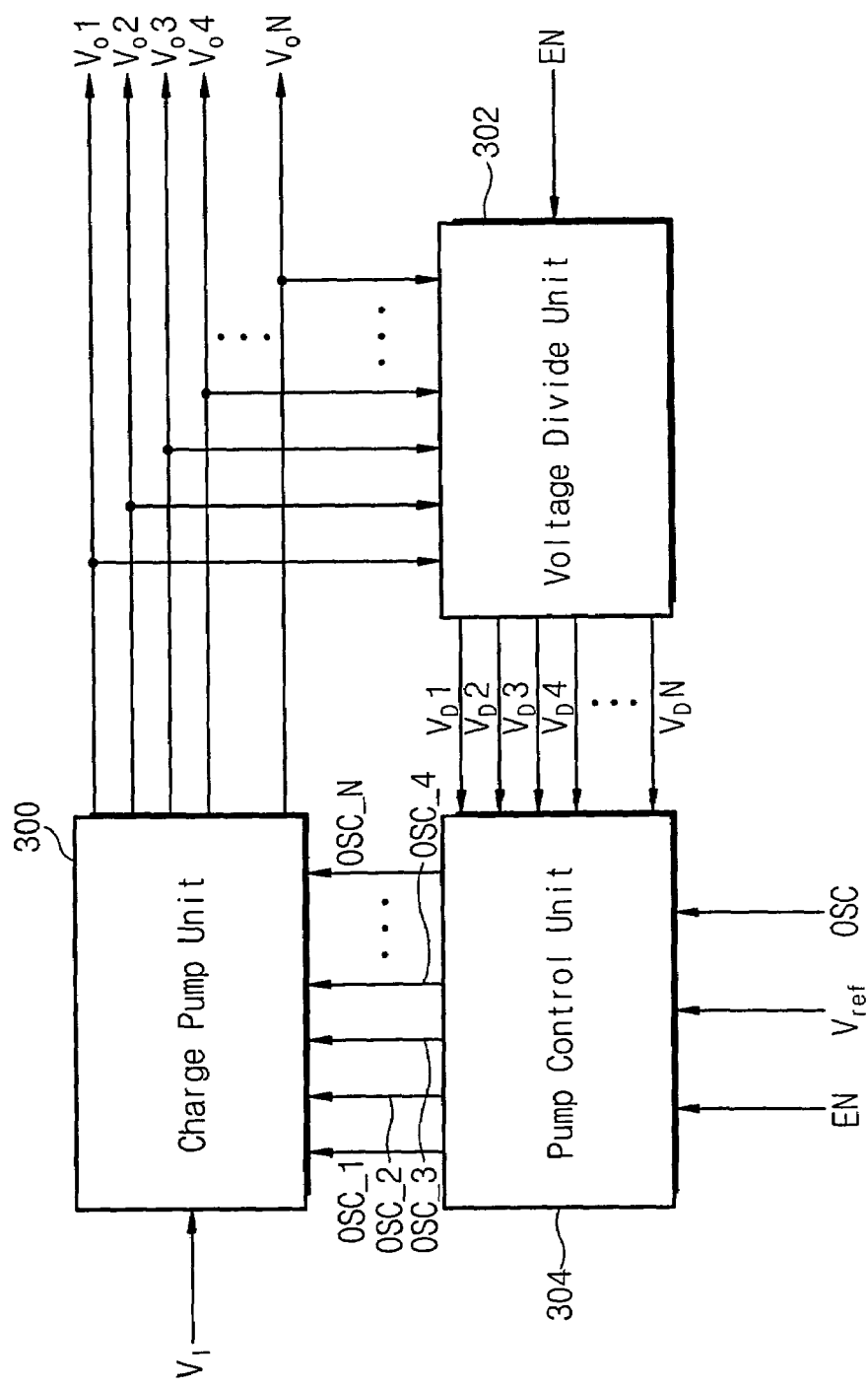
FIG. 3 is a block diagram illustrating a multi-level high voltage generator according to some embodiments of the invention.

FIG. 3 is a block diagram illustrating a multi-level high voltage generator according to some embodiments of the invention. Referring to FIG. 3, the multi-level high voltage generator includes a charge pump unit 300, a voltage divider unit 302, and a pump control unit 304.

The charge pump unit 300 raises one input voltage $V_I$ applied through an input terminal to generate a plurality of high voltages $V_O1 \sim V_ON$ having different voltage levels. In this case, the voltage raise operation by the charge pump unit 300 is controlled by the pump control signals OSC_0 through OSC_N inputted from the pump control unit 304.

Figure 4:
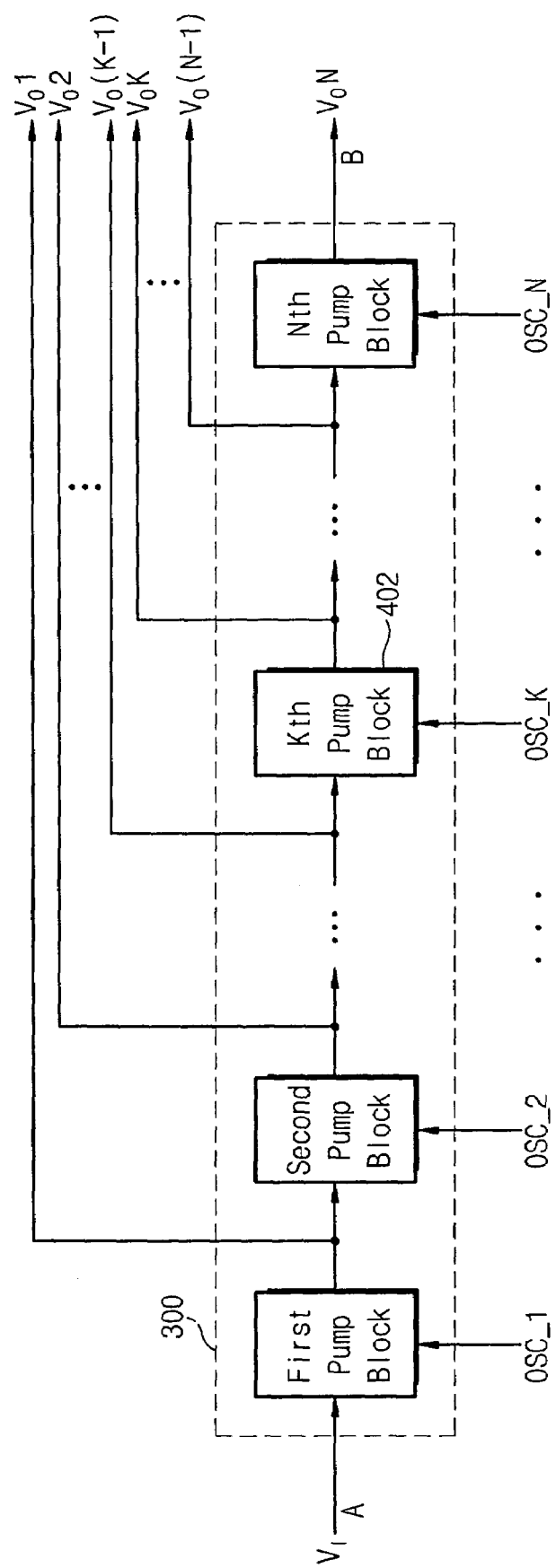
FIG. 4 is a block diagram illustrating an example charge pump unit suitable for the multi-level high voltage generator of FIG. 3.

FIG. 4 is a block diagram illustrating an example charge pump unit 300 suitable for the multi-level high voltage generator of FIG. 3. As shown in FIG. 4, the charge pump unit 300 includes a plurality of pump blocks connected in series between an input terminal A of the charge pump unit 300 and a final output terminal B. Each of the pump blocks raises the input voltage according to a pump control signal OSC_1~OSC_N to output. The output voltages from each of the pump blocks become an output of the charge pump unit. Each output voltage also becomes an input voltage for the next pump block. That is, a Kth pump block 402 is controlled by the Kth pump control signal OSC_K to raise an input voltage (an output voltage ($V_O(K-1)$)) of the K−1th pump block) and inputs the raised voltage $V_OK$ to a K+1th pump block. In addition, the raised voltage $V_OK$ is applied as input to a divider voltage unit 302 as an output of the charge pump unit 300.

Figure 5:
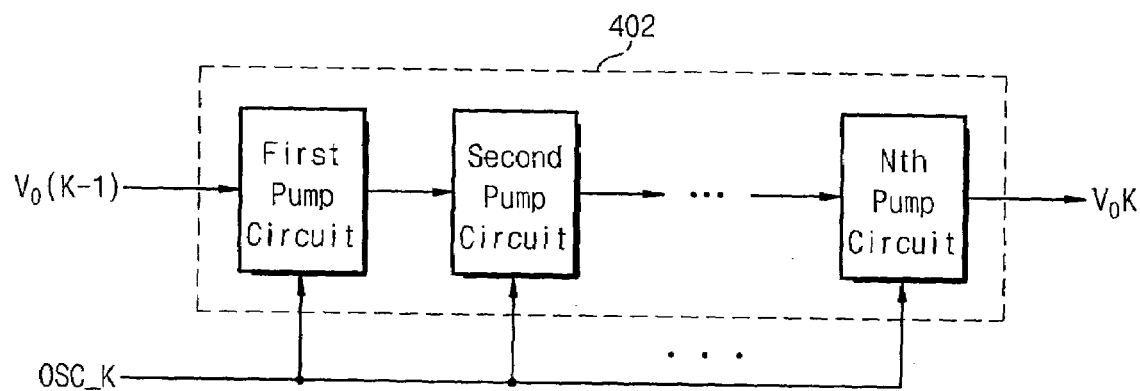
FIG. 5 is a block diagram illustrating an example Kth pump block suitable for the charge pump unit of FIG. 4.

FIG. 5 is a block diagram illustrating an example Kth pump block suitable for the charge pump unit of FIG. 4. As illustrated in FIG. 5, the pump block 402 includes a number of pump circuits (pump circuit 1 through pump circuit n) that are connected in series. The pump block 402 generates and outputs a desired target voltage by the combined operation of each of the pump circuits. The other pump blocks of FIG. 4 may have a similar composition to that of FIG. 5 except for a different pump control signal and the number of pump circuits in the pump block. Any circuit that raises an input voltage may be used as the pump circuit.

Figure 6:
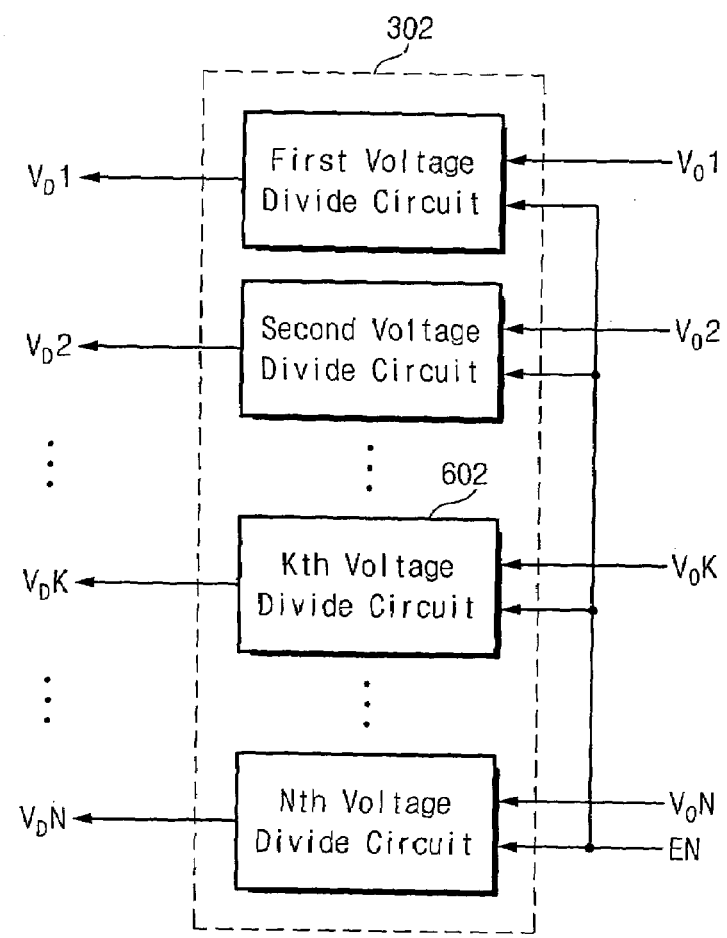
FIG. 6 is a block diagram illustrating an example voltage divider unit suitable for the multi-level high voltage generator of FIG. 3.

FIG. 6 is a block diagram illustrating an example voltage divider unit suitable for the multi-level high voltage generator of FIG. 3. As illustrated in FIG. 6, the voltage divider unit 302 includes a number of voltage divider circuits each dividing the input voltages $V_O1$ through $V_ON$. Each of the voltage divider circuits divides the voltages $V_O1$ through $V_ON$ that are applied from the charge pump unit 300 and outputs the divided voltages $V_D1$ through $V_DN$ to the pump control unit 304 if an enable signal EN is externally applied.

Figure 7:
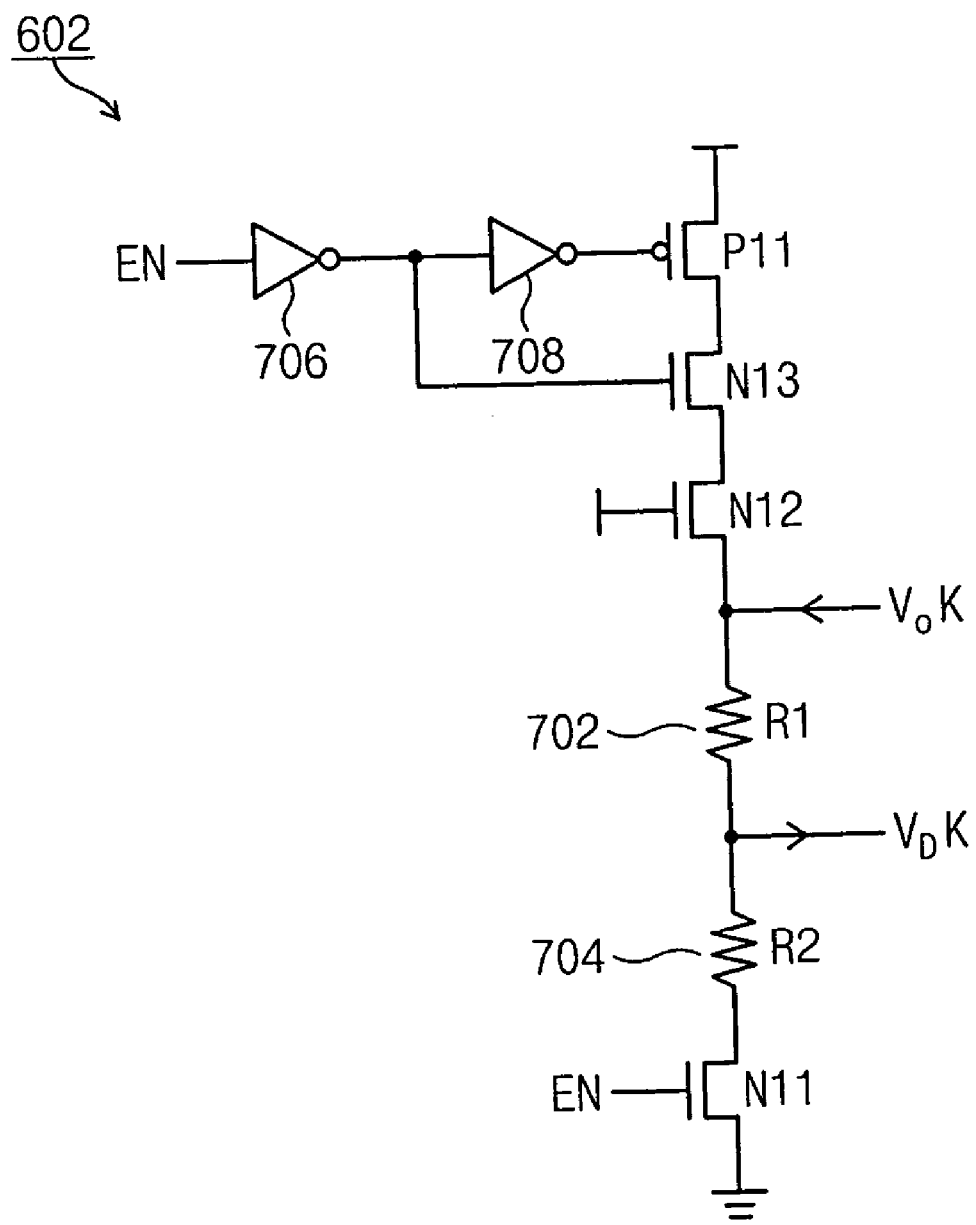
FIG. 7 is a circuit diagram illustrating an example voltage divider circuit suitable for the voltage divider unit of FIG. 6.

FIG. 7 is a circuit diagram illustrating an example Kth voltage divider circuit 602 suitable for the voltage divider unit of FIG. 6. Referring to FIG. 7, the Kth voltage divider circuit 602 includes inverters 706 and 708 for controlling the voltage divider circuit, a number of MOS transistors P11, N11, N12, and N13, and resistors R1 and R2 that are connected in series. The Kth voltage divider circuit 602 divides a high voltage $V_OK$ applied from the charge pump unit 300 according to the ratio between the resistances of the series-connected resistors 702 and 704. That is, if the external enable signal EN is applied, the high voltage $V_OK$ from the charge pump unit 300 is divided according to the ratio of resistances R2/(R1+R2) to generate the divided voltage $V_DK$. The other voltage circuits have a similar structure to that of FIG. 7, but the resistances of the resistors R1 and R2 may be different because the other applied high voltages and the other divided voltages are different.

Figure 8:
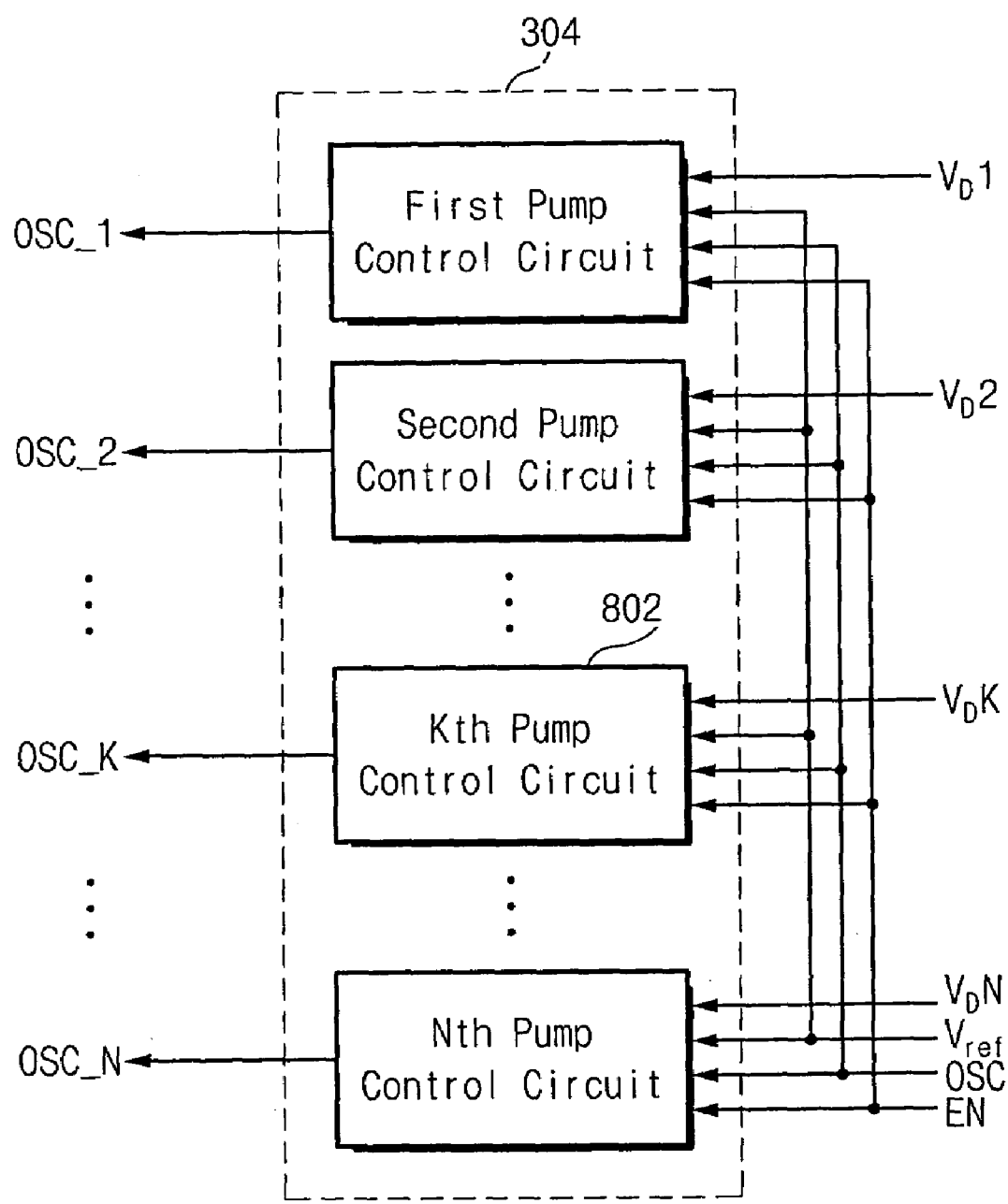
FIG. 8 is a block diagram illustrating an example pump control unit suitable for the multi-level high voltage generator of FIG. 3.

FIG. 8 is a block diagram illustrating an example pump control unit suitable for the multi-level high voltage generator of FIG. 3. As illustrated in FIG. 8, a pump control unit 304 operates according to an externally applied enable signal EN, and includes a number of pump control circuits. Each pump control signal generates one of the pump control signals OSC_1 through OSC_N in response to one of the divided voltages $V_D1$ through $V_DN$, respectively, from the voltage divider unit 302 and the predetermined reference voltage Vref. Each of the pump control signals OSC_1 through OSC_N generated by the pump control circuits controls a voltage raise operation for one of the pump circuits included in the charge pump unit 300.

Figure 9:
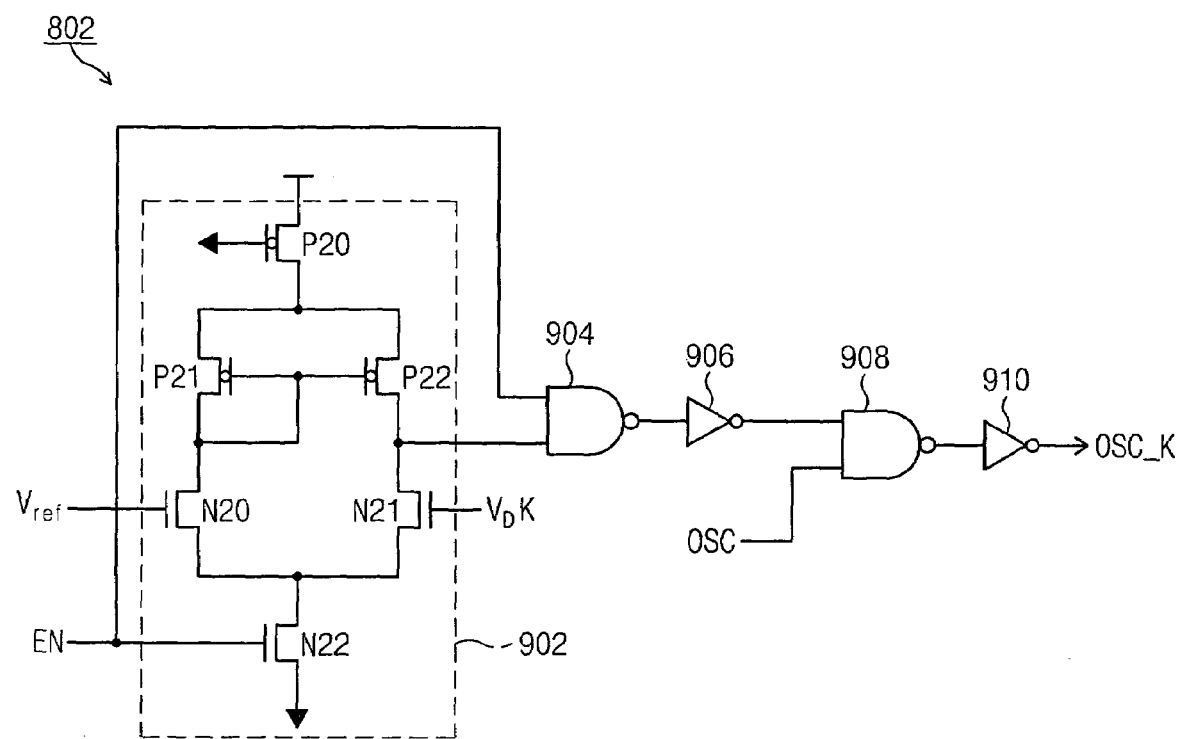
FIG. 9 is a circuit diagram illustrating an example pump control circuit suitable for the pump control unit of FIG. 8.

FIG. 9 is a circuit diagram illustrating an example Kth pump control circuit suitable for the pump control unit 304 of FIG. 8. Referring to FIG. 9, the pump control circuit 802 includes a differential amplifier 902 and a logic circuit. The differential amplifier 902 includes a number of PMOS transistors P20, P21, and P22 and NMOS transistors N20, N21, and N22. The logic circuit includes a number of NAND gates 904 and 908 and inverters 906 and 910. The differential amplifier 902 serves as a comparator for comparing the reference voltage Vref with the applied divided voltage $V_DK$ to maintain the divided voltage $V_DK$ at the same level as the reference voltage Vref.

The differential amplifier 902 of the pump control circuit 802 compares the divided voltage $V_DK$ with the reference voltage Vref. If the divided voltage $V_DK$ is lower than the reference voltage Vref, a pump control signal OSC_K is generated using the control clock signal OSC and applied to the Kth pump block 402 of the charge pump unit 300. As described above, if a pump control signal $OSC_{13}$ K is applied to the pump block 402, each of the pump circuits raises the input voltage by the voltage raise operation. In contrast, if the divided voltage $V_DK$ is larger than the reference voltage Vref, the pump control circuit 802 does not generate a pump control signal OSC_K. Therefore, the pump block 402 cuts off the voltage raise operation to maintain the previous output voltage. That is, the pump block 402 determines that the output $V_OK$ has reached the desired voltage and stops the voltage raise operation of each pump circuit.

According to the present invention, an input voltage is raised by one charge pump unit to simultaneously generate high voltages at various levels. Therefore, the integration density of semiconductor memories requiring high voltages at various levels can be increased.

It will be apparent that slight changes and modifications may be made to the exemplary embodiments described above without abandoning the inventive concepts illustrated by those embodiments. Accordingly, the invention is not limited to the specific embodiments described in the disclosure, but by the scope and breadth of the following claims.

The invention claimed is:

1. A multi-level high voltage generator comprising:
   a charge pump unit structured to generate high voltages having different voltage levels by raising one input voltage inputted through an input terminal, the charge pump unit comprising pump blocks connected in series between the input terminal and an output terminal;
   a voltage divider unit structured to operate according to an external enable signal and structured to generate divided voltages in response to the high voltages from the charge pump unit; and
   a pump control unit structured to operate according to the external enable signal and structured to generate pump control signals in response to a reference voltage, a control clock signal, and the divided voltages from the voltage divider unit, each of the pump control signals corresponding to one of the divided voltages, each of the pump control signals structured to control the charge pump unit to perform a voltage raise operation for generating one of the high voltages,
   wherein each one of the pump blocks is structured to receive a corresponding one of the pump control signals as input, wherein each one of the pump blocks is structured to raise an input voltage in response to the corresponding one of the pump control signals, and wherein the corresponding one of the pump control signals received by each one of the pump blocks is independent of any of the other pump control signals received by any of the other pump blocks.

2. The device of claim 1, wherein the pump blocks comprise pump circuits connected in series, the pump circuits in one pump block structured to be controlled by the same pump control signal.

3. The device of claim 2, wherein each pump circuit is structured to perform a voltage raise operation to an input voltage when the pump control signal is inputted.

4. The device of claim 2, wherein the pump circuits does not perform a voltage raise operation when the pump control signal is not inputted.

5. The device of claim 1, wherein the voltage divider unit comprises a plurality of voltage divider circuits, each voltage divider circuit corresponding to one of the high voltages from the charge pump unit.

6. The device of claim 5, wherein each voltage divider circuit comprises resistors connected in series, each voltage divider circuit structured to divide the one of the high voltages according to a resistance ratio of the resistors in response to the enable signal.

7. The device of claim 1, wherein the pump control unit comprises pump control circuits, each pump control circuit corresponding to one of the divided voltages inputted from the voltage divider unit.

8. The device of claim 7, wherein each pump control circuit comprises:

a differential amplifier structured to operate according to the external enable signal and structured to maintain levels of the reference voltage and the divided voltage; and logic circuits structured to generate the pump control signal in response to an output of the differential amplifier, the external enable signal, and the control clock signal.

9. The device of claim 8, wherein the pump control signal is outputted as a clock signal.

10. The device of claim 1, wherein the charge pump unit is structured to generate each of the high voltages at a different output of the charge pump unit.

11. A multi-level high voltage generator comprising:

a charge pump unit structured to generate high voltages having different voltage levels by raising one input voltage inputted through an input terminal, the charge pump unit including pump blocks connected in series between the input terminal and an output terminal, the pump blocks including pump circuits connected in series;

a voltage divider unit structured to operate according to an external enable signal and structured to generate divided voltages in response to the high voltages from the charge pump unit; and a pump control unit structured to operate according to the external enable signal and structured to generate pump control signals in response to a reference voltage, a control clock signal, and the divided voltages from the voltage divider unit, each of the pump control signals corresponding to one of the divided voltages, each of the pump control signals structured to control the charge pump unit to perform a voltage raise operation for generating one of the high voltages, the pump circuits in one pump block structured to be controlled by the same pump control signal.

12. The device of claim 11, wherein each pump circuit is structured to perform a voltage raise operation to an input voltage when the pump control signal is inputted.

13. The device of claim 11, wherein the pump circuit does not perform a voltage raise operation when the pump control signal is not inputted.

14. The device of claim 11, wherein the voltage divider unit comprises a plurality of voltage divider circuits, each voltage divider circuit corresponding to one of the high voltages from the charge pump unit.

15. The device of claim 14, wherein each voltage divider circuit comprises resistors connected in series, each voltage divider circuit structured to divide the one of the high voltages according to a resistance ratio of the resistors in response to the enable signal.

16. The device of claim 11, wherein the pump control unit comprises pump control circuits, each pump control circuit corresponding to one of the divided voltages inputted from the voltage divider unit.

17. The device of claim 16, wherein each pump control circuit comprises:

a differential amplifier structured to operate according to the external enable signal and structured to maintain levels of the reference voltage and the divided voltage; and logic circuits structured to generate the pump control signal in response to an output of the differential amplifier, the external enable signal, and the control clock signal.

18. The device of claim 17, wherein the pump control signal is outputted as a clock signal.

* * * * *

UNITED STATES PATENT AND TRADEMARK OFFICE
CERTIFICATE OF CORRECTION

PATENT NO. : 7,176,747 B2  Page 1 of 1
APPLICATION NO. : 10/940808
DATED : February 13, 2007
INVENTOR(S) : Seung-Jae Lee et al.

It is certified that error appears in the above-identified patent and that said Letters Patent is hereby corrected as shown below:

Column 1, line 62, the words "100 reached" should read -- 100 has reached --;
Column 1, lines 63-64, the words "voltage operation" should read -- voltage raise operation --.

Signed and Sealed this

Twenty-eighth Day of July, 2009

JOHN DOLL
*Acting Director of the United States Patent and Trademark Office*